(12) United States Patent
Michalski

(10) Patent No.: US 6,831,579 B2
(45) Date of Patent: Dec. 14, 2004

(54) BICMOS LATCHES WITH NPN CONTROL DEVICES FOR CURRENT LIMITING OF NPN REGENERATION DEVICES

(75) Inventor: Christopher Michalski, High Point, NC (US)

(73) Assignee: Analog Devices, Inc., Norwood, MA (US)

( * ) Notice: Subject to any disclaimer, the term of this patent is extended or adjusted under 35 U.S.C. 154(b) by 41 days.

(21) Appl. No.: 10/456,595

(22) Filed: Jun. 6, 2003

(65) Prior Publication Data

US 2004/0027265 A1 Feb. 12, 2004

(Under 37 CFR 1.47)

Related U.S. Application Data

(60) Provisional application No. 60/387,525, filed on Jun. 6, 2002.

(51) Int. Cl.[7] .............................................. H03M 3/00
(52) U.S. Cl. ........................................................ 341/143
(58) Field of Search ................................. 341/143, 133, 341/136

(56) References Cited

U.S. PATENT DOCUMENTS

| 5,625,308 A | | 4/1997 | Matsumoto et al. ......... 327/203 |
|---|---|---|---|
| 5,760,626 A | * | 6/1998 | Pelley, III ................... 327/207 |
| 5,801,565 A | | 9/1998 | Kuo ........................... 327/202 |
| 5,808,514 A | | 9/1998 | Kolluri ....................... 330/267 |
| 5,825,256 A | | 10/1998 | Tchamov et al. ........... 331/113 |

* cited by examiner

Primary Examiner—Brian Young
(74) Attorney, Agent, or Firm—Koppel, Jacobs, Patrick & Heybl

(57) ABSTRACT

Latch structures and systems are disclosed that enhance latch speed and provide complementary metal-oxide-semiconductor (CMOS)-level latch signals. They are realized with bipolar junction structures and CMOS structures that are arranged to enhance regenerative feedback signals and generate CMOS-level latch signals.

12 Claims, 2 Drawing Sheets

BICMOS LATCHES WITH NPN CONTROL DEVICES FOR CURRENT LIMITING OF NPN REGENERATION DEVICES

CROSS REFERENCES TO RELATED APPLICATIONS

This application claims the benefit of U.S. Provisional Application Ser. No. 60/387,525 filed Jun. 6, 2002.

BACKGROUND OF THE INVENTION

1. Field of the Invention

The present invention relates generally to electronic latches.

2. Description of the Related Art

A variety of modern signal-conditioning systems require electronic latches which can be latched to indicate the state of a fluctuating input signal at a selected latch time. Because these systems often process complementary metal-oxide-semiconductor (CMOS) signals and generally operate at high speeds, there is a continuing search for latch structures that enhance latch speed but provide CMOS-level latch signals.

BRIEF SUMMARY OF THE INVENTION

The present invention is directed to latch structures and systems that realize enhanced latch speed while providing CMOS-level latch signals. These goals are realized with bipolar junction structures and CMOS structures that are arranged to enhance regenerative feedback signals and generate CMOS-level latch signals.

The novel features of the invention are set forth with particularity in the appended claims. The invention will be best understood from the following description when read in conjunction with the accompanying drawings.

DETAILED DESCRIPTION OF THE INVENTION

Figure 1:
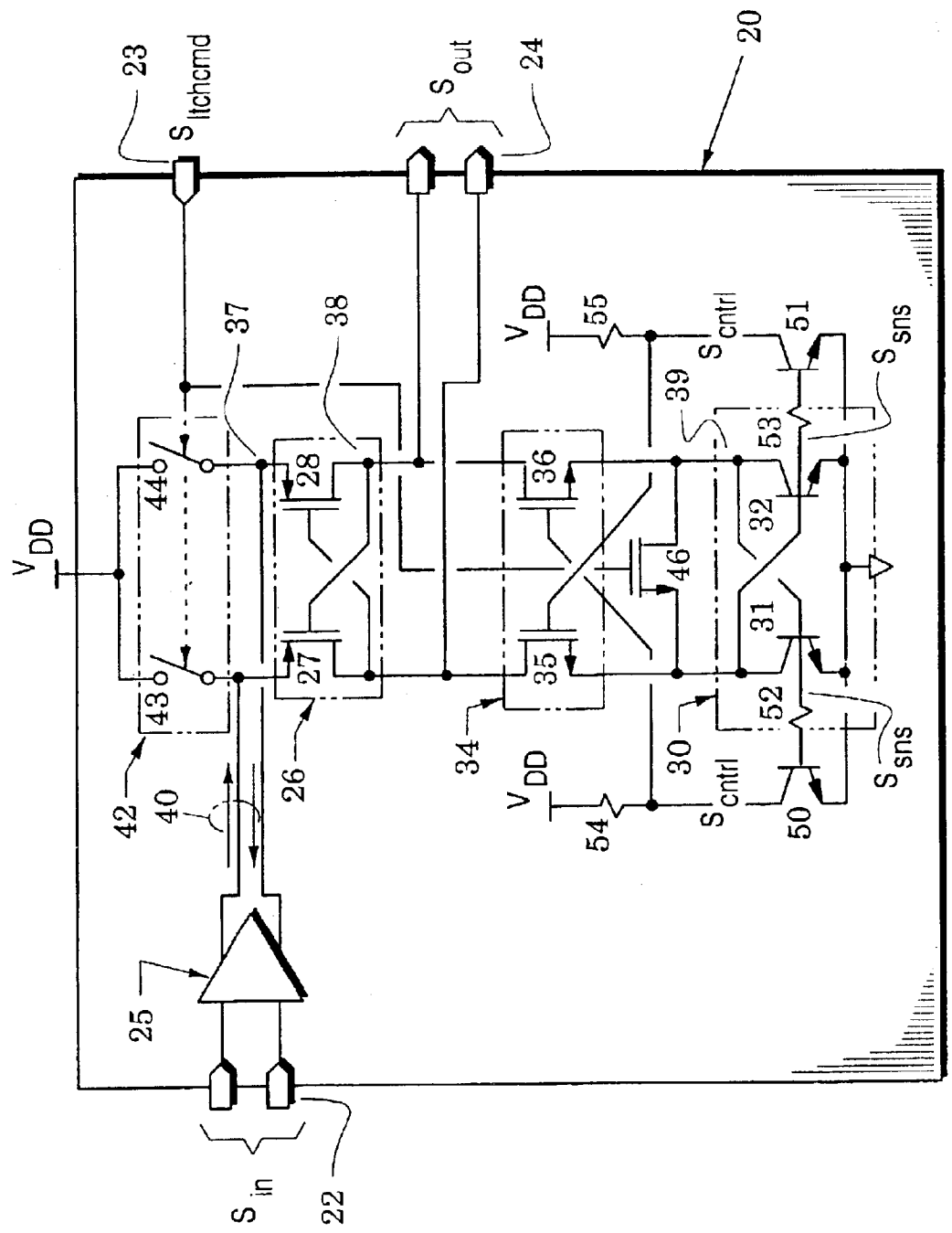
FIG. 1 is a schematic diagram of a latch embodiment of the present invention.

FIG. 1 illustrates a latch embodiment 20 that receives a differential input signal $S_{in}$ at a differential input port 22. The latch tracks the input signal during an acquire mode and transitions from the acquire mode to a latch mode in response to a latch command signal $S_{ltchcmd}$ at a command port 23. During the latch mode, the latch provides, at a differential output port 24, a differential output signal $S_{out}$ which corresponds to the state of the input signal $S_{in}$ at the time that the latch command signal $S_{ltchcmd}$ was initiated. The latch's structure obtains a number of significant advantages which are indicated in the following description.

In particular, the latch 20 includes a differential amplifier 25, a cross-coupled pair 26 of first and second isolation transistors 27 and 28, a cross-coupled pair 30 of first and second latch transistors 31 and 32 and a pair 34 of first and second current-limiting transistors 35 and 36. The isolation transistors 27 and 28 have first current terminals (e.g., sources) 37 and second current terminals 38 (e.g., drains), the latch transistors 31 and 32 provide collectors 39 and the current-limiting transistors 35 and 36 are each coupled between a respective one of the second current terminals 38 and a respective one of the collectors 39. The differential amplifier 25 is coupled between the differential input port 22 and the first current terminals 37 and provides a differential signal, e.g., a differential current 40, in response to the input signal $S_{in}$.

The latch 20 also includes a pair 42 of first and second switches 43 and 44 and preferably includes a shorting transistor 46 that are all responsive to the latch command signal $S_{ltchcmd}$ at the command port 23. The switches 43 and 44 are coupled to the first current terminals 37 and the shorting transistor 46 is coupled between the collectors 39.

The latch 20 further includes first and second control transistors 50 and 51 that each have a base coupled to a respective one of the collectors 39 and has a collector coupled to a control terminal (e.g., gate) of the current-limiting transistor that is also coupled to that respective one of the collectors 39. Preferably, resistors 52 and 53 are inserted in the bases of the control transistors 50 and 51 and resistors 54 and 55 couple their collectors to a supply voltage (e.g., $V_{DD}$).

The cross-coupling of the isolation transistors 27 and 28 and the latch transistors 31 and 32 provides positive feedback which will urge the latch transistors into one of two stable states in response to the differential current 40 (latch transistor 31 is on and latch transistor 32 is off in a first state and latch transistor 31 is off and latch transistor 32 is on in a second state). In an acquisition operational mode, however, the latch command signal $S_{ltchcmd}$ is in a state that turns off the switches 43 and 44 and causes the shorting transistor 46 to present a low shorting impedance between the collectors 39.

Accordingly, the low shorting impedance of the shorting transistor 46 substantially eliminates feedback signals and the latch transistors 31 and 32 are thus restrained from moving to either of their stable states. In addition, the switches 43 and 44 do not supply currents that would support either stable state. In the acquisition mode, therefore, the collectors 39 remain relatively low so that the control transistors 50 and 51 remain off and a high signal ($V_{DD}$) is applied to the control terminals (e.g., gates) of the current-limiting transistors 35 and 36. In response, these transistors present relatively low acquire impedances.

The latch operational mode is initiated when the latch command signal $S_{ltchcmd}$ changes to a state that turns on the switches 43 and 44 and causes the shorting transistor 46 to transition from its low shorting impedance to a greater isolating impedance. Accordingly, the cross-coupled feedback process of the latch is enabled and it rapidly urges the latch 20 into the stable state that is indicated by the differential current 40 at the time when the latch command signal $S_{ltchcmd}$ was initiated.

In the indicated stable state, one of the latch transistors 31 and 32 is on and the other is off. The base of the "on" latch transistor provides a sense signal $S_{sns}$ to the base of one of the control transistors 50 and 51. In response, that control transistor's collector provides a control signal $S_{cntrl}$ to the gate of one of the current-limiting transistors that causes its impedance to transition from the low acquire impedance to a greater latch impedance. In particular, the control signal $S_{cntrl}$ is substantially $V_{be}+V_{gs}$ wherein $V_{be}$ is the base to emitter voltage of the control transistor and $V_{gs}$ is the gate-to-source voltage of the current-limiting transistor.

This lowered control signal initiates the significantly greater latch impedance in the current-limiting transistor which reduces the base current to the "on" latch transistor and limits its saturation. The latch impedance also generates the upper level of a CMOS-level signal at a corresponding side of the output port 24 while the lower level is provided at the other side of the output port.

As with any electronic structure, parasitic capacitances are inevitably associated with the output signal port 24 and, accordingly, the regenerative time constant of the latch 20 is proportional to this parasitic capacitance divided by the transconductance of either of the latch transistors 31 and 32. Because the transconductance of bipolar junction transistors is proportional to their collector current, they generally provide a substantially lower time constant than other transistors.

Accordingly, latch structures of the present invention realize a number of important latch features. First, they provide CMOS-level output signals $S_{out}$ which are desired by a variety of CMOS systems yet their latch speed is enhanced because cross-coupled bipolar junction latch transistors drive the latch's regenerative feedback. Current drain is reduced because the current drawn from the switches (43 and 44) that corresponds to an "off" isolation transistor (27 or 28) drops to substantially zero and the base current to the "on" latch transistor is limited. The limited base current further enhances the latch speed.

Figure 2:
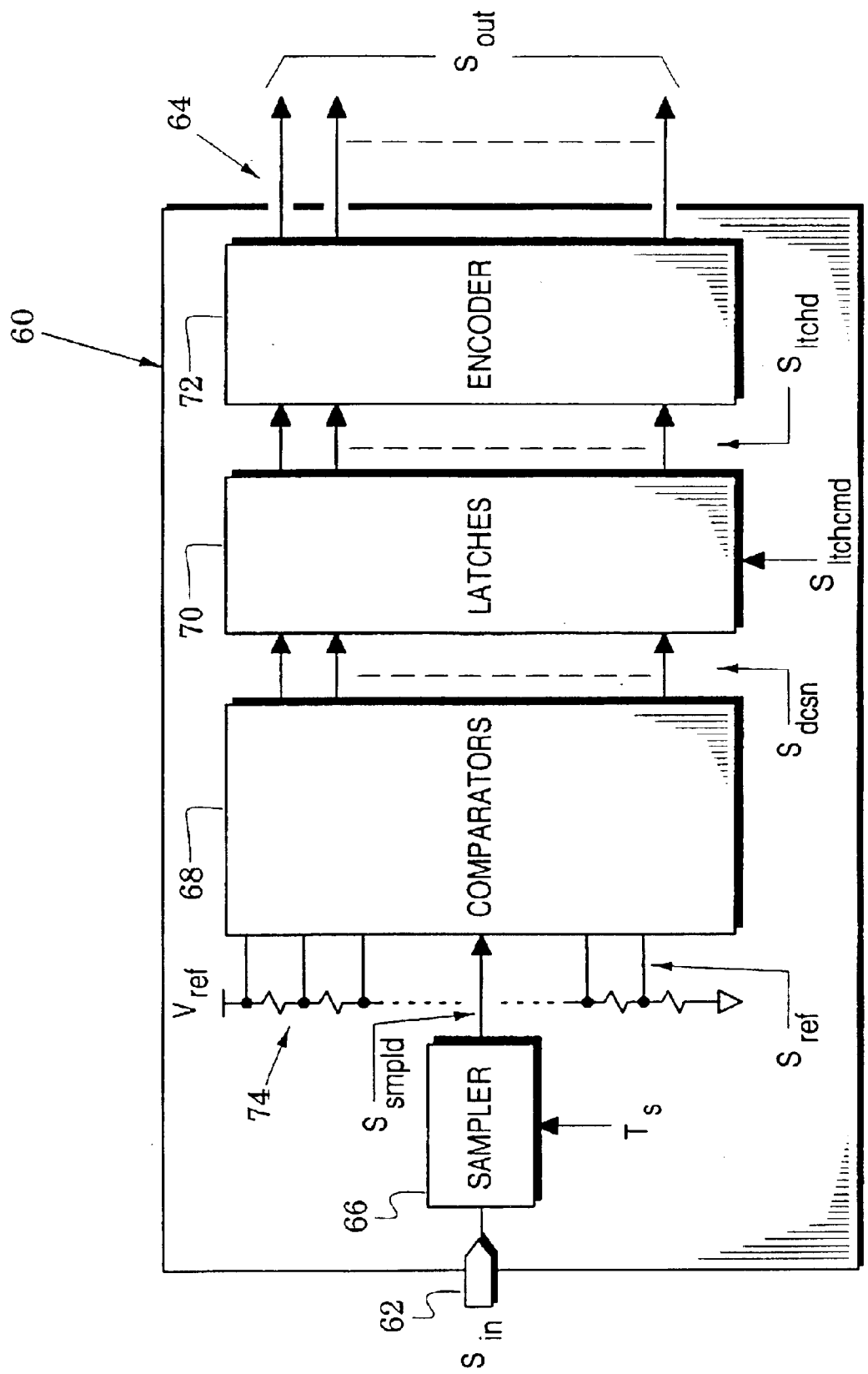
FIG. 2 is block diagram of an analog-to-digital converter that includes the latch of FIG. 1.

Latch embodiments of the invention are especially important in systems that employ a significant number of latches. For example, FIG. 2 illustrates a flash analog-to-digital converter (ADC) 60 which converts an analog input signal $S_{in}$ at an input port 62 to a digital output signal $S_{out}$ at an output port 64. The ADC 60 includes a sampler 66, comparators 68, latches 70 and encoders 72.

A resistive ladder 74 provides reference signals $S_{ref}$ and, in response to the input signal $S_{in}$ (which may be a differential signal) and timing signals $T_s$, the sampler 66 provides sample signals $S_{smpl}$. The comparators compare each sample signal to the reference signals and provide decision signals $S_{dcsn}$ that define the state of the sample relative to the reference signals.

In response to a latch command signal $S_{ltchcmd}$ (also shown at command port 23 in FIG. 1), the latches 70 provide latched output signals $S_{ltchd}$ which correspond to the state of the decision signals $S_{dcsn}$ at the time of the latch command signal $S_{ltchcmd}$. The latched output signals $S_{ltchd}$ are then converted to various digital output signal formats, e.g., an N-bit binary output or a Gray-code binary output).

Although latch embodiments of the invention essentially perform a sampling process, the flash ADC 60 preferably includes the sampler 66 so that the comparators 68 can process a held signal rather than a changing signal. Because the ADC 60 may contain a substantial number of latches, its current drain can be significantly reduced by use of the latch embodiments of the invention.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A latch that transitions from an acquire mode to a latch mode in response to a latch command signal, the latch comprising:
    cross-coupled first and second isolation transistors that have first and second current terminals with said first current terminals coupled to receive a differential input signal;
    cross-coupled first and second latch transistors that provide collectors;
    at least one switch coupled to provide currents to said first current terminals in response to said latch command signal;
    first and second current-limiting transistors that are each coupled between a respective one of said second current terminals and a respective one of said collectors and that each provide an impedance that transitions from an acquire impedance to a greater latch impedance in response to a corresponding one of control signals $S_{cntrl}$; and
    first and second control transistors that each provides one of said control signals $S_{cntrl}$ to a respective one of said current-limiting transistors in response to the one of said collectors that is coupled to that current-limiting transistor.

2. The latch of claim 1, further including:
    a shorting transistor coupled between said collectors and responding to said latch command signal; and
    a differential amplifier that provides said differential input signal.

3. The latch of claim 1, wherein:
    said latch transistors and said control transistors are bipolar junction transistors; and
    said isolation transistors and said current-limiting transistors are metal-oxide-semiconductor transistors.

4. A latch that transitions from an acquire mode to a latch mode in response to a latch command signal, the latch comprising:
    cross-coupled first and second isolation transistors that have first and second current terminals with said first current terminals coupled to receive a differential input signal;
    cross-coupled first and second latch transistors that provide collectors;
    first and second current-limiting transistors that are each coupled between a respective one of said second current terminals and a respective one of said collectors and that each provide an impedance that transitions from an acquire impedance to a greater latch impedance in response to respective ones of control signals $S_{cntrl}$;
    a shorting transistor that is coupled between said collectors and transitions from a shorting impedance to a greater isolating impedance in response to said latch command signal; and
    first and second control transistors that each provides one of said control signals $S_{cntrl}$ to a respective one of said current-limiting transistors in response to the one of said collectors that is coupled to that current-limiting transistor.

5. The latch of claim 4, further including:
    at least one switch coupled to provide currents to said first current terminals in response to said latch command signal; and
    a differential amplifier that provides said differential input signal.

6. The latch of claim 4, wherein:
    said latch transistors and said control transistors are bipolar junction transistors; and
    said isolation transistors, said current-limiting transistors and said shorting transistor are metal-oxide-semiconductor transistors.

7. An analog-to-digital converter that converts an analog input signal to a corresponding digital output signal in response to a latch command signal, comprising:

a sampler that provides a sample of said analog input signal;

a resistor ladder that provides a plurality of reference signals;

comparators that generate comparison signals in response to said sample and said reference signals;

latches that provide latched output signals in response to said comparison signals and said latch command signal; and an encoder that generates said digital output signal in response to said latched output signals;

wherein each of said latches transitions from an acquire mode to a latch mode in response to said latch command signal and includes:
- a) cross-coupled first and second isolation transistors that have first and second current terminals with said first current terminals coupled to receive a differential input signal;
- b) cross-coupled first and second latch transistors that provide collectors;
- c) at least one switch coupled to provide currents to said first current terminals in response to said latch command signal;
- d) first and second current-limiting transistors that are each coupled between a respective one of said second current terminals and a respective one of said collectors and that each provide an impedance that transitions from an acquire impedance to a greater latch impedance in response to a corresponding one of control signals $S_{cntrl}$; and
- e) first and second control transistors that each provides one of said control signals $S_{cntrl}$ to a respective one of said current-limiting transistors in response to the one of said collectors that is coupled to that current-limiting transistor.

8. The converter of claim 7, further including:

a shorting transistor coupled between said collectors and responding to said latch command signal; and a differential amplifier that provides said differential input signal.

9. The converter of claim 7, wherein:

said latch transistors and said control transistors are bipolar junction transistors; and said isolation transistors and said current-limiting transistors are metal-oxide-semiconductor transistors.

10. An analog-to-digital converter that converts an analog input signal to a corresponding digital output signal in response to a latch command signal, comprising:

a sampler that provides a sample of said analog input signal;

a resistor ladder that provides a plurality of reference signals;

comparators that generate comparison signals in response to said sample and said reference signals;

latches that provide latched output signals in response to said comparison signals and said latch command signal; and an encoder that generates said digital output signal in response to said latched output signals;

wherein each of said latches transitions from an acquire mode to a latch mode in response to said latch command signal and includes:
- a) cross-coupled first and second isolation transistors that have first and second current terminals with said first current terminals coupled to receive a differential input signal;
- b) cross-coupled first and second latch transistors that provide collectors;
- c) first and second current-limiting transistors that are each coupled between a respective one of said second current terminals and a respective one of said collectors and that each provide an impedance that transitions from an acquire impedance to a greater latch impedance in response to respective ones of control signals $S_{cntrl}$;
- d) a shorting transistor that is coupled between said collectors and transitions from a shorting impedance to a greater isolating impedance in response to said latch command signal; and
- e) first and second control transistors that each provides one of said control signals $S_{cntrl}$ to a respective one of said current-limiting transistors in response to the one of said collectors that is coupled to that current-limiting transistor.

11. The converter of claim 10, further including:

at least one switch coupled to provide currents to said first current terminals in response to said latch command signal; and a differential amplifier that provides said differential input signal.

12. The converter of claim 10, wherein:

said latch transistors and said control transistors are bipolar junction transistors; and said isolation transistors, said current-limiting transistors and said shorting transistor are metal-oxide-semiconductor transistors.

* * * * *